United States Patent [19]

Edmark, III

[11] Patent Number: 4,640,619
[45] Date of Patent: Feb. 3, 1987

[54] MICROLITHOGRAPHIC CALIBRATION SCHEME

[75] Inventor: Karl W. Edmark, III, Seattle, Wash.

[73] Assignee: GCA Corporation, Andover, Mass.

[21] Appl. No.: 711,587

[22] Filed: Mar. 13, 1985

[51] Int. Cl.$^4$ ............................................. C01B 11/00
[52] U.S. Cl. ................................................... 356/372
[58] Field of Search ............... 356/358, 383, 394, 397, 356/399, 400, 401, 372, 375; 355/43, 45

[56] References Cited

U.S. PATENT DOCUMENTS 4,311,390  1/1982  Phillips ................................ 356/358
4,473,293  9/1984  Phillips ................................ 355/45

Primary Examiner—R. A. Rosenberger
Attorney, Agent, or Firm—Pahl, Lorusso & Loud

[57] ABSTRACT

The calibration scheme disclosed herein is applicable to microlithographic systems of the type in which alignment between successive exposures is provided by means of a microscope mounted to one side of the optical projection column, there being a laser metered stage for transporting a semiconductor wafer between the microscope and an optical projection column. In accordance with the practice of the invention, a wafer with a light sensitive coating is placed on the stage and transported to the column using an approximate base line value. After exposure from a reticle which includes fiducial markings, the wafer is transported by the stage to the microscope. By observing the latent image on the coating, the precise stage movement required to align the latent image of the fiducial markings on the wafer with the microscope system reference reticle may be measured with the laser metered stage. The base line value is then corrected based on the actual measurement.

2 Claims, 5 Drawing Figures

MICROLITHOGRAPHIC CALIBRATION SCHEME

BACKGROUND OF THE INVENTION

The present invention relates to microlithographic systems of the type used for the manufacture of semiconductor devices by the printing of successive circuit patterns on the surface of a semiconductor wafer, and more particularly, to such a system in which alignment between successive exposures is provided by means of a microscope mounted to one side of the optical projection column.

As is understood by those skilled in the art, the successful manufacturer of complex semiconductor devices requires that very precise registration be maintained between the successive exposures which are used to produce the successive layers required in building up such devices. To provide a basis establishing registration between successive exposures, alignment systems typically employ a system of fiducial markings. These markings start out on a reticle or mask of the type used for forming the semiconductor circuits themselves and are transferred to the surface of a wafer by the lithographic process. After development of the first exposure the mark is observed by means of a microscope and is used to initially position each wafer prior to its being moved into the projections column for subsequent exposures.

One of the problems with this prior art system is that it relies on there being a precisely defined separation or base line vector between the point of observation and the point in the optical projection column which corresponds to the original location of the fiducial mark on the wafer surface. To establish this base line vector, it has been typically necessary to employ an elaborate setup or initialization procedure in which two successive reticles are used to expose the wafer and, after respective developments, the accuracy of the registration was determined by microscopic observation. Typically, the two successive reticles provided patterns which included x-and-y-axis vernier scales to facilitate quantitative measurement of any offset.

Not only is this procedure time consuming and therefore expensive, involving as it does two successive development procedures before any feedback information is obtained, but the end result is a function not only of the base line vector but also of the accuracy with which the second reticle was aligned with the first and also the degree of accuracy with which the wafer was initially positioned prior to its second trip into the optical column for exposure. Further, the time required for this procedure is so long, i.e., in the order of twenty five minutes or greater, that the base line vector may in fact drift during this period. As is understood by those skilled in the art, baseline drift can arise through a variety of causes including such innocuous effects as slight thermal changes in the optical column itself, barometric changes or mechanical shock. While these changes may be small in an everyday context, they can have considerable significance when it is desired to reduce an overlay of complex optical patterns with an accuracy finer than a micron.

Among the several objects of the present invention it may be noted the provision of an alignment scheme for a microlithographic system which provides high accuracy; the provision of such an aligning method which permits corrective information to be rapidly generated; the provision of such a method of which permits base line correction to be determined substantially independently of other possible variables; the provision of such a method may be implemented with existing equipment; and the provision of such a method which is relatively simple and inexpensive. Other objects and features will be in part apparent and in part pointed out hereinafter.

SUMMARY OF THE INVENTION

Briefly, the present invention is applicable to a microlithographic system for optically projecting circuit patterns on semiconductor wafers in which alignment between successive exposures is provided by means of a microscope mounted to one side of the optical projection column, there being a metered stage for transporting a wafer between the microscope and the optical projection column. A wafer provided with a light sensitive coating is placed on the stage and is transported to the projection column using an approximate baseline value for metering movement of the stage. At the image plane of the column, the wafer is exposed from a reticle which includes fiducial markings. Without removing the wafer from the stage, it is then transported to the microscope and, by observing the latent image on the coating, the actual stage movement required to align the latent image of the fiducial markings on the wafer with the microscope reticle is measured. Then the base line value is corrected based on this actual measurement.

BRIEF DESCRIPTION OF THE DRAWINGS

Corresponding reference characters indicate corresponding parts throughout the several views of the drawings.

DESCRIPTION OF THE PREFERRED EMBODIMENT

Figure 1:
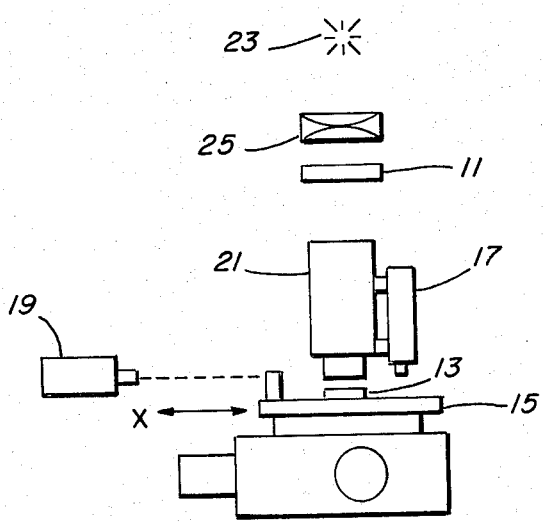
FIG. 1 is a diagramatic side view of a microlithographic system of a type to which the method of the present invention is applicable.

Referring now to FIG. 1, the microlithographic system illustrated there is adapted for the manufacturer of semiconductor circuits by projecting circuit patterns onto a semiconductor wafer coated with a light sensitive resist.

A preferred type of apparatus for the practice of the present invention is the microlithographic step and repeat system manufactured and sold by the GCA Corporation of Bedford, Mass., under the trademark DSW, and designated by it as the GCA 6300/B fitted with the AWA II alignment system and high contrast microscope. This is a direct step on a wafer type of machine which typically exposes a wafer with a repeated pattern by stepping the wafer at the image plane of the projection column.

In FIG. 1 the platen which is provided to hold a reticle at the object plane of the projection column is indicated by reference character 11, while a chuck for holding a semiconductor wafer is indicated by reference character 13. Chuck 13 is carried on an x-y stage 15 for movement which allows a wafer held in a chuck to be moved outside of the optical projection system for unloading and loading and for inspection under a microscope, designated by reference character 17. For purposes of simplification, the loading station is not shown in FIG. 1. Motion of the stage 15 is provided by suitable servo motors, metering of the stage movement being provided by a laser interferometer apparatus which detects and measures movement for each orthagonal axis. In FIG. 1 the laser interferometer for the X-axis is indicated by reference character 19.

In addition to the reticle holding platen, the optical projection column includes a precision projection lens 21, a light source 23, and a condenser lens 25 for directing light from the source 23, through the reticle held in platen 11 into lens 21 and then down onto the wafer surface. As is usual with systems of this type, operations of the subcomponents of the GCA 6300/B machine are coordinated under computer control. In particular, the computer control system can direct the stage to certain XY coordinates and the servo system electronically causes the stage to be traversed to that location, using information provided by the laser interferometer system which tracks stage position.

As indicated previously, one of the parameters stored in and utilized by the computer is the so-called base line value or vector, this being the distance between the optical axis of the microscope and the optical axis of the projection column. As with other parameters utilized in driving the stage 15, the base line value contemplates both the X and the Y axis and is thus a vector rather than a mere scalar value. In the operation of the system, various vectors and locations, including the base line vector are initially defined as a nominal value and then progressively updated, starting from a simple physical measurement, progressing through various prior art alignment techniques up to the system of the present invention.

In normal wafer production techniques, the wafer, after loading, is transported to the microscope for alignment with previous layers and, after alignment, is moved into the projection column for exposure, the movement being predicated on the base line vector. In making the calibration exposure, in accordance with the practice of the method of the present invention, however, the wafer may be moved directly from the loading station to the projection column. It will be understood by those skilled in the art, however, that this movement is still based or predicated upon the stored base line vector, this vector, whether approximate or accurate, being used in calculations to achieve the actual movement of the stage to arrive at the desired destination.

Figure 2:
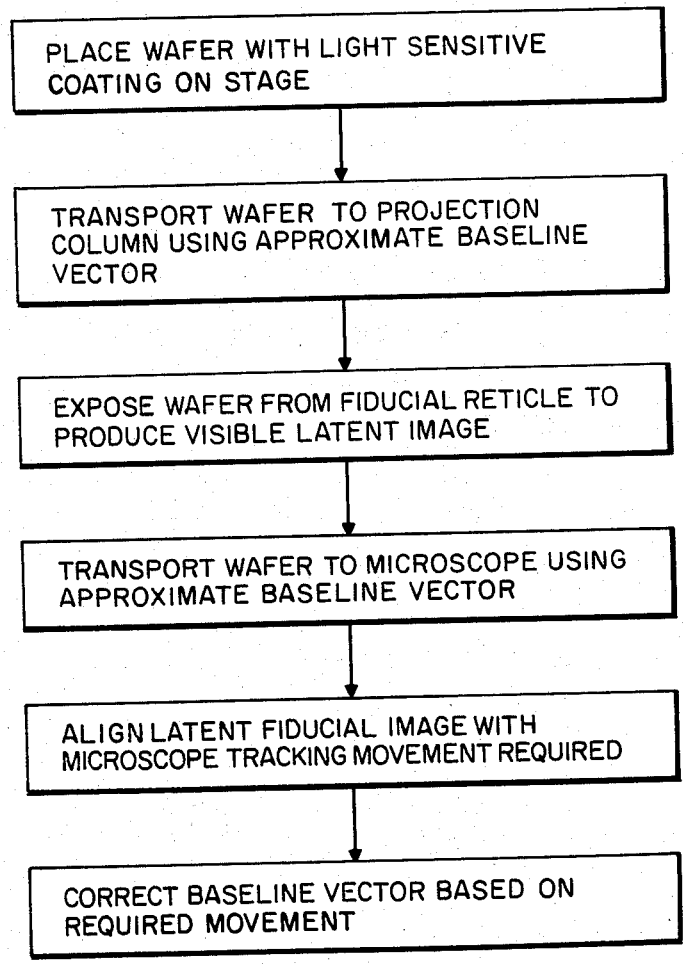
FIG. 2 is a flow chart of a preferred way of practicing the method of the present invention.

In accordance with the practice of the present invention, laid out in a step wise fashion in FIG. 2, a wafer provided with a light sensitive coating is loaded into the stage 15 and is moved into approximate alignment with the projection column using an approximate baseline vector in the movement calculations.

Figure 3:
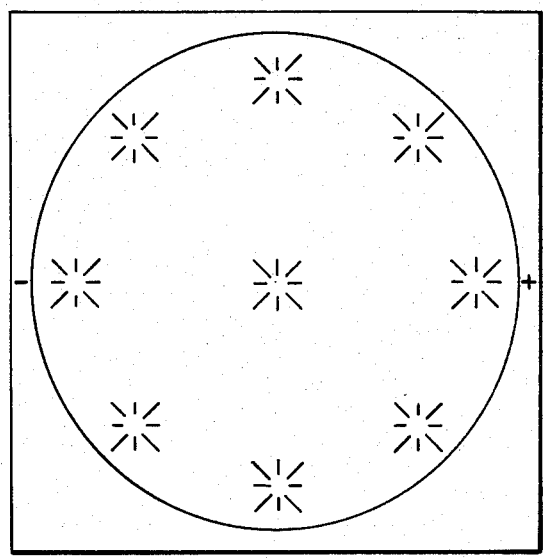
FIG. 3 is a diagramatic illustration of a projection reticle pattern useful in the practice of the present invention.

While thusly positioned at the nominal axis of the projection column, the coated wafer is exposed from a reference radial including various fiducial markings. A preferred form of such markings is shown in simplified fashion in FIG. 3. As may be seen in FIG. 3, the pattern includes a series of similar markings, one at the center of the reticle field and eight around the perimeter of the reticle, one at each 45 degree angular increment. For the purpose of initial base line correction, the central marking is of principle interest.

In accordance with the practice of the present invention, the coated wafer is exposed at a sufficient intensity or time to produce a latent image which is in fact visible. In one aspect the present invention involves the discovery that certain lithographic resists exhibit a visible latent image. In other words, even though the image has not been developed in accordance with the usual manufacturing process, a change occurs which can be observed. This change is believed to be due to bleaching of the materials used. Polymer type positive resist appears to be particularly useful in this regard, one particular resist being the AZ 1470 resist available from the Shipley Company of Newton, MA. While the bleaching effect is relatively slight, e.g. producing a contrast ratio of only about 7 percent, the change can be observed with the use of a high contrast microscope. The effect is in fact sufficient to permit either visual observation or observation through a video camera such as that typically employed in wafer align systems such as the AWA II referenced previously.

Figure 4:
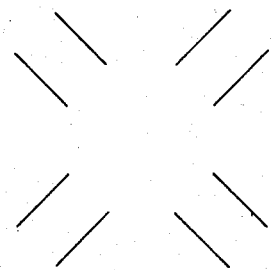
FIG. 4 is a diagramatic illustration of an alignment microscope system reference reticle pattern useful in the practice of the present invention.

After exposure, the wafer is transported on the XY stage to the microscope 17. Initially this movement is predicated on the approximate base line vector, i.e., to bring the latent image of the central fiducial mark within the operative field of the microscope. However, further movement of the stage is provided to bring the latent image of the central fiducial mark into exact registration with the microscope reticle, the movement at all time being tracked by the laser interferometer system. A preferred form of pattern for a microscope reticle which facilitates aligning of the latent image fiducial marking is illustrated in FIG. 4. Preferably, illumination at the microscope is provided by a light source which is filtered to minimize further exposure of the light sensitive coating.

The movement to bring about exact registration may be either manually controlled or under the servo control of an electronic wafer alignment system. e.g., the AWA II system. This additional movement is then applied by the computer as a correction to the stored base line vector so that an updated or highly exact value for the base line vector is obtained. This initialized or calibrated value can then be utilized in actual production where wafers, having had an initial pattern applied and developed, are upon introduction to the system, first brought into postion under the microscope 17 for alignment and are then transferred to a postion under the projection column for further printing using the updated and refined base line vector.

If desired, the method of the present invention can also be performed periodically during production runs by bringing wafers back to the microscope after exposure, e.g. to perform "on the fly" checking of alignment.

Figure 5:
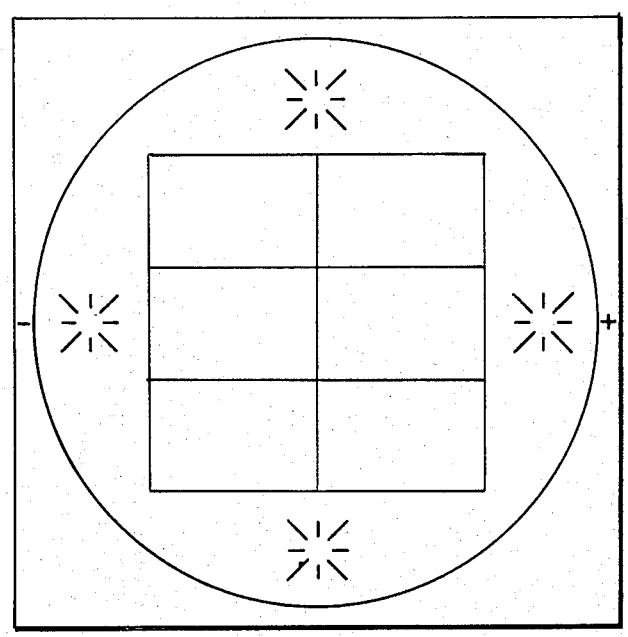
FIG. 5 is a diagramatic illustration of a production reticle pattern useful in the practice of another form of the present invention.

In addition to base line correction, the alignment technique of the present invention may also be used to facilitate the rapid correction of various other alignment registration and overlay parameters during the wafer fabrication process. Referring to FIG. 5, a reticle pattern is shown which includes four fiducial markings, similar to those in FIG. 3, in addition to rectangular integrated circuit patterns 55. As is understood by those skilled in the art, the circuit patterns are normally rectangular, both individually and in assemblage suitable for step and repeat microlithography, while the useful field of the projection lens 21 is circular. Thus the fiducial marks 55 are conveniently located in the normally unused areas of the field outside the chordal lines which define the rectangular circuit pattern area.

By exposing the coated wafer with such a fiducial mark pattern and then transporting the wafer on the stage using nominal stored vectors to put each of these fiducial marks in succession within the field of a microscope 17, error or offset values may be obtained for each mark. By mathematically combining or finding the center of the these marks, a value corresponding to the nonexistent central fiducial mark can be obtained and the base line vector can thereby be updated even during a run of production wafers. Further, to the extent that the individual errors or offsets do not correspond to the ideal values, computational analysis can determine the cause of the deviation from among various possible effects. Corrections may be made in the magnification ratio for the projection column or corrections may be made in the position of the reticle itself if errors in that position have produced a rotated or skewed (trapezoidal) dislocation of the corresponding latent images on the wafer surface.

If, for example, the reticle held in platen 11 is not perfectly parallel to the wafer held in chuck 13 or if the lens axis is not perfectly orthogonal, the image on the wafer may be slightly trapezoidal. This deviation from rectangular will show up in the offset values determined by measuring the distance actually required to position the corresponding fiducial components of the latent image in alignment with the reticle in the microscope. Based on this information corrections may be made, either manually or under servo control, in the positioning of the platen and reticle. Likewise, if the reticle has been somewhat rotated in the platen 11, corresponding offsets will occur in the measurements taken when the corresponding fiducial marks are aligned with the microscope so that corrective action may be taken. In this case the corrective action may be performed either by correction of the position of the radical or by producing a compensating rotation of the wafer since the chucks employed for holding such wafers typically include a provision for small angular rotations to achieve initial alignment.

In view of the foregoing, it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:

1. In a microlithographic system for optically projecting circuit patterns on semiconductor wafers in which alignment between successive exposures is provided by means of a microscope mounted to one side of the optical projection column, there being a metered stage for transporting a wafer between the microscope and the optical projection column, the method of correcting the the baseline vector between the projection column and the microscope, which method comprises:

placing, on said stage, a wafer with a light sensitive coating;

transporting said wafer to said column using an appropriate baseline vector for controlling movement of said stage;

exposing said wafer from a reticle which includes pattern reference markings to produce a visible latent image;

without removing said wafer from said stage, transporting said wafer to said microscope;

by observing, with said microscope, the latent image on said film, measuring the actual stage movement required to align the latent image of said fiducial markings on said wafer with the microscope; and correcting said baseline vector based on said actual measurement.

2. In a microlithographic system for optically projecting circuit patterns from projection reticles onto semiconductor wafers in which alignment between successive exposures is provided by means of a microscope mounted to one side of the optical projection column, there being a metered stage for transporting a wafer between the microscope and the optical projection column, the method of correcting alignment between a projection reticle and a wafer, which method comprises:

placing, on said stage, a wafer with a light sensitive coating;

transporting said wafer to said column using an appropriate baseline vector for controlling movement of said stage;

exposing said wafer from a reticle which includes a plurality of pattern reference markings to produce a visible latent image;

without removing said wafer from said stage, transporting said wafer to said microscope;

by observing, with said microscope, the latent image on said film, measuring the actual stage movement required to align each of the latent image reference markings on said wafer with the microscope; and calculating, from said several measurements, the relative positioning corrections necessary for correcting alignment.

* * * * *